United States Patent
Jarvis et al.

(10) Patent No.: US 6,721,188 B1
(45) Date of Patent: Apr. 13, 2004

(54) POWER SUPPLY FOR LOW PROFILE EQUIPMENT HOUSING

(75) Inventors: Jerry Jarvis, South Weymouth, MA (US); Robert Wiley, Topsfield, MA (US)

(73) Assignee: Network Engines, Inc., Chelmsford, MA (US)

( * ) Notice: Subject to any disclaimer, the term of this patent is extended or adjusted under 35 U.S.C. 154(b) by 0 days.

(21) Appl. No.: 09/899,761

(22) Filed: Jul. 5, 2001

Related U.S. Application Data
(60) Provisional application No. 60/215,996, filed on Jul. 5, 2000.

(51) Int. Cl.[7] .............................. H05K 7/02; H05K 7/06; H05K 7/08; H05K 7/10
(52) U.S. Cl. ..................... 361/760; 361/736; 361/748; 361/777; 361/785
(58) Field of Search ................. 361/736, 694, 361/695, 801, 724–727, 732, 770, 747–748, 759–760, 772, 802, 785, 741, 756, 685, 737, 788, 826, 816, 818, 820, 799, 753, 777; 312/223.1, 223.2; 24/41.17, 26.2; 174/261, 70 R, 71 R–72 R, 72 A, 52.1, 52.2, 52.3

(56) References Cited

U.S. PATENT DOCUMENTS 4,974,121 A * 11/1990 Masuko et al. .............. 361/826
5,557,506 A * 9/1996 Wood et al. ................. 361/796

* cited by examiner

Primary Examiner—Phuong T. Vu
(74) Attorney, Agent, or Firm—David J. Powsner; Nutter, McClennen & Fish

(57) ABSTRACT

A digital data processing device, e.g., a web server, having a power supply and at least one component such as a motherboard or a disk drive powered by the power supply and interconnected therewith by a power transfer element which is separate from the power supply and the component. The power transfer element is adapted to physically mate with the power supply and the powered component and to provide electrical coupling between them along a non-obstructing path of defined geometry. It includes a substantially rigid card, e.g. a circuit card, with at least one conductive pathway, and further aspects of the invention provide mechanisms for coupling the power transfer element to the supply and to the other component while orienting the card within the chassis. The power transfer card may carry an edge connector into which the edge of a power supply card fits, or vice-versa, so power enters conductors on the card at a proximal edge or end of the card. The conductors run to one or more lands positioned to couple power from conductive pathways out by direct contact to one or more conductive posts or stand-offs. Thus the card mounts parallel to one or more other boards, or devices, or is positioned parallel to a cooling air flow with minimally obstructive cross-section, and is securely held in a defined position and geometry within the chassis.

24 Claims, 5 Drawing Sheets

POWER SUPPLY FOR LOW PROFILE EQUIPMENT HOUSING

CROSS-REFERENCE TO RELATED APPLICATIONS

This application claims priority from earlier filed U.S. provisional patent application Ser. No. 60/215,996, filed Jul. 5, 2000, which is incorporated herein by reference.

This application is related to the following commonly assigned applications, the teachings of all of which are incorporated herein by reference: U.S. Ser. No. 60/215,952, filed Jul. 5, 2000, entitled "Server Architecture and Methods for Digital Data Processing," U.S. Ser. No. 60/215,975, filed Jul. 5, 2000, entitled "Low Profile, High Density Storage Array," U.S. Ser. No. 60/215,997, filed Jul. 5, 2000, entitled "Ventilating Slide Rail Mount," U.S. Ser. No. 60/215,995, filed Jul. 5, 2000, entitled "Circuit Board Riser," U.S. Ser. No. 60/216,055, filed Jul. 5, 2000, entitled "Low Profile Equipment Housing with Angular Fan," U.S. Ser. No. 60/244,354, filed Oct. 30, 2000, entitled "Ventilating Slide Rail Mount," and U.S. Ser. No. 60/244,361, filed Oct. 30, 2000, entitled "Low Profile, High Density Storage Array."

BACKGROUND OF THE INVENTION

The present invention relates digital data processing devices, and, in particular, to methods and apparatus for powering such devices with internal power supplies. The invention has particular application in compact, "low profile" devices where space is at a premium and where overheating is of concern.

The components within a digital data processing apparatus require electricity at various defined voltages, such as 3.3, 5, or 12 volts, for their operation, and a number of these components such as standard CD-ROMs and microprocessor chips require substantial power, e.g., twenty to forty watts of power. This power is generally provided by one or more internal power supplies mounted on the device chassis. These convert 110–115 or 220–230 volt alternating current (AC) signal into lower voltage direct current (DC) potentials, supplying the DC drive signals through a number of output terminals at the different levels required by the respective components.

According to the prior art, power generated by an internal supply is typically routed to other components of a device via electrical cables having one or more cable connectors, e.g., plugs or sockets. While this is adequate for many applications, it can prove problematic when internal space is at a premium and, specifically, where heat build-up is a concern. In addition to being difficult to insert and route cabling within a tightly packed device chassis, cables can obstruct the internal air flow. Though cables can sometimes be re-routed and fans can be used to compensate for such blockage, the tendency toward more densely packed circuitry and lower profile devices challenges one's ability to rely on cable connections and renders cable routing problematic. The integrity of such cables and their connectors, moreover, may suffer from flexing, abrasion or loosening if the chassis is repeatedly opened or the cables are frequently jarred.

One area of particular concern arises for web servers, wherein racks or cabinets may hold many, e.g., tens or hundreds, of closely-packed substantially identical communications and data storage units in a small space, each with their associated support cards and one or more power supplies. Such cabinets may have one, two, three or more vertical stacks of the units, and may be packed ten or more high. Each unit may reside in a closed box-like chassis or covered tray unit that slides drawer-like into the rack. These chassis have a standard width (e.g., 19 inches) and a standardized height (1U, 2U or 3U), and the rack may possess threaded securing holes spaced every inch or so along its front face for bolting the chassis into the rack.

The problems of effectively cooling such devices and arranging internal cabling are particularly severe for 1U size rack-mounted storage arrays, in which CD ROMS or memory units must be powered by and connected to a power supply that sits with the CD ROMS in a slide-in assembly barely two inches tall. Since cooling air must circulate through the unit, the provision of cabling to interconnect the power supplies with driver devices may impede air-flow. Cables may also be subject to loosening, or to wear or abrasion from flexing into contact with the walls or the cover plate of such a unit.

One object of the present invention is to provide an improved digital data storage apparatus and methods.

A more particular object is to provide such apparatus and methods as are particularly adapted to web servers and other data processing apparatus that are compact of design and/or intolerant of overheating.

A still further object is to provide such apparatus and methods as can be implemented at low cost.

A still further object of the invention is to provide such apparatus and methods as can be adapted to pre-existing equipment, as well as designed for use in new equipment.

SUMMARY OF THE INVENTION

One or more of the aforementioned objects are met by the present invention which provides, in one aspect, a digital data processing device such as, by way of non-limiting example a network or web server device, having a power supply, at least one component, e.g. a motherboard or a disk drive, and a power transfer element. The power transfer element provides electrical coupling between the power supply and the component and, as such, can serve in the place of conventional wires or cables. It comprises a substantially rigid power transfer card, e.g. a circuit card, with at least one conductive pathway. The power transfer element, according to one aspect of the invention, is not integral to either the power supply or the component, though it is adapted to physically mate with them to provide electrical coupling. Preferably, the number of pathways on the power transfer card is large, increasing with the amount of power to be coupled, and the pathways connect at one end to a smaller number of lands.

Further aspects of the invention provide mechanisms for coupling the power transfer element to the supply and the other component. For example, the power supply can comprise an edge card on which are disposed conductive pathways or vias carrying output power. The transfer element, correspondingly, can comprise an adapter or edge connector mounted on the power transfer card and matable with the edge card of the power supply.

By way of further example, the power transfer element may also include, or be adapted for use with, a fastening mechanism that provides physical and electrical coupling between the lands of the power transfer card and a component. The fastening element can be, e.g., a screw or a screw and spacer or other one-to-one connector, that provides removable physical and electrical coupling between the substantially rigid power transfer card and a circuit board in the powered component. At least one aperture can be provided in the card for receiving the fastening element and for transferring power from the conductive pathways to the component circuit board.

In another embodiment, the present invention is directed to a power transfer system comprising a power supply having an edge card, an edge connector adapted to mate with the edge card and carried by a substantially rigid power transfer card that has a plurality of conductive power pathways, a component having a circuit board, and a power-coupling fastening element for removably and conductively securing the power transfer card to the circuit board. The connector and the card carry power from the power supply to the component, and the mounting and connecting arrangement assure that the power is carried along a rigid, non-flexing conductive array lying in a plane parallel to, and generally offset from one or both or the boards to which it connects. One or both of the power supply edge card, and the power transfer card may employ multiple parallel conductive paths to carry substantial currents without the need for wires or cables, and multiple paths may connect to a common, high current capacity fastening element.

The present invention has several advantages over the prior art. Among these is that it eliminates the need for cables or flexing elements to transfer power from the power supply to the component. In particular embodiments, the power transfer card may be positioned parallel to, but offset from one or both of the device board and the power supply board. The conductive fastening elements may be metal stand-offs or column-like pedestals. This can improve airflow within the chassis and eliminate the need for complex wire routings. These advantages are particularly relevant for digital data processing apparatus, such as servers, where space is constrained, movable chassis covers may jar loose wires, and the components are particularly sensitive to accumulating internally-generated heat.

BRIEF DESCRIPTION OF THE DRAWINGS

The invention will be more fully understood from the following detailed description taken in conjunction with the accompanying drawings, in which.

DETAILED DESCRIPTION OF THE DRAWINGS

Figure 1:
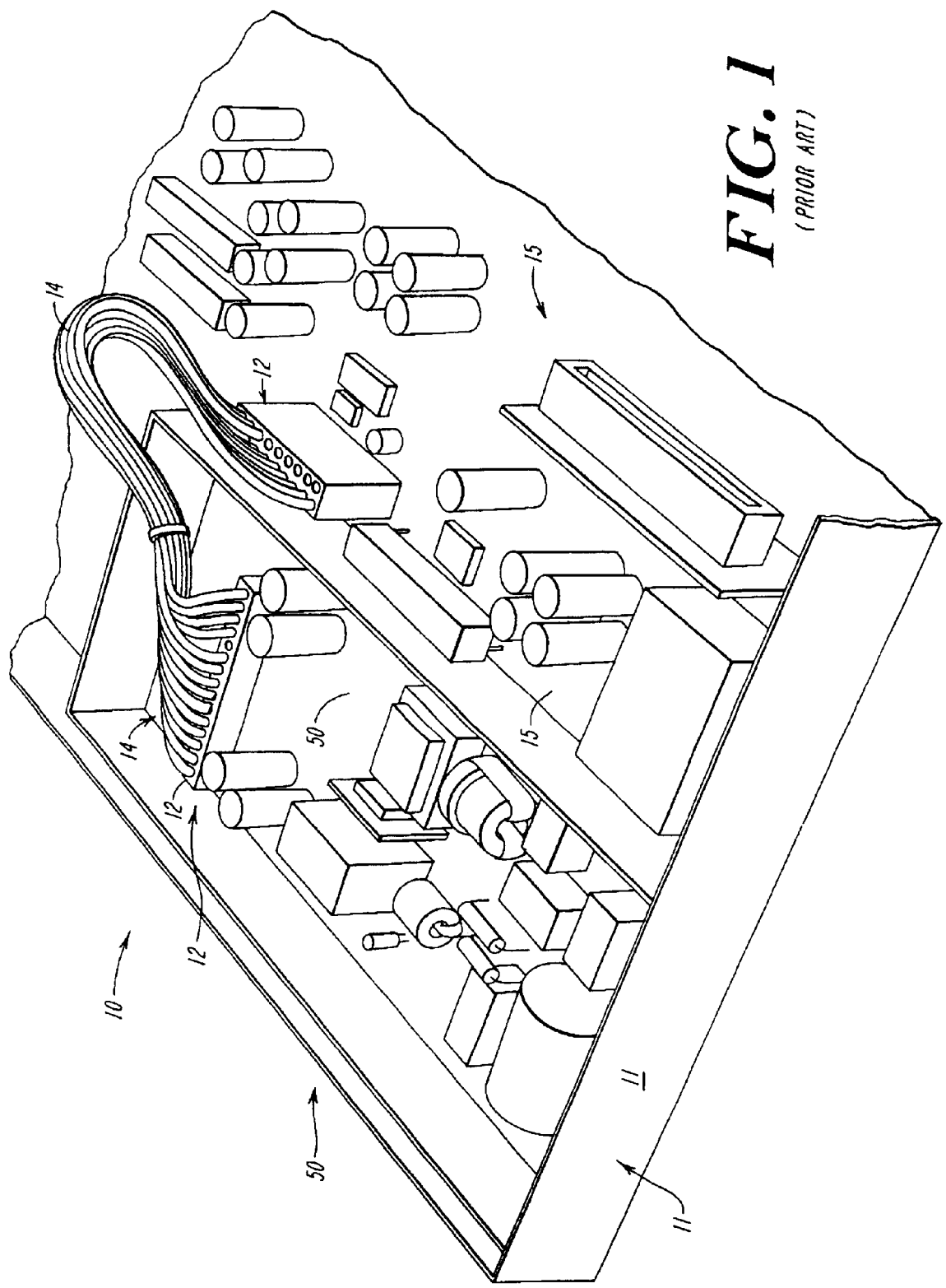
FIG. 1 depicts a portion of a prior art digital data processor device utilizing cables or wires for power transfer.

FIG. 1 shows a digital data processing device 10 having a power transfer system according to the prior art. The data processing system 10 includes a number of typical components disposed within a chassis 11, including a power supply 50, a system board 15, power cabling 14, and connectors 12. The cabling 14 comprises a plurality of polymercoated copper wires that are bundled, banded and routed throughout the chassis 11 of the device, terminating at plug or socket connectors, such as connector 12, at various boards therein. Unless properly positioned, such cabling 14 can block the airflow through the chassis 11, and may also be subjected to manipulation, jarring, vibration or other forces that may result in abrasion of the insulation, shorts or cracks, loosening of a connector, or may otherwise lessen its integrity. While not illustrated, the device may be a rack-mount device, in which the chassis 11 is closed by a hinged cover plate to form a compact unit in which the chassis and cover may constrain a cooling air flow within the chassis that is intended to dissipate heat and maintain the components within a desired temperature range.

Figure 2:
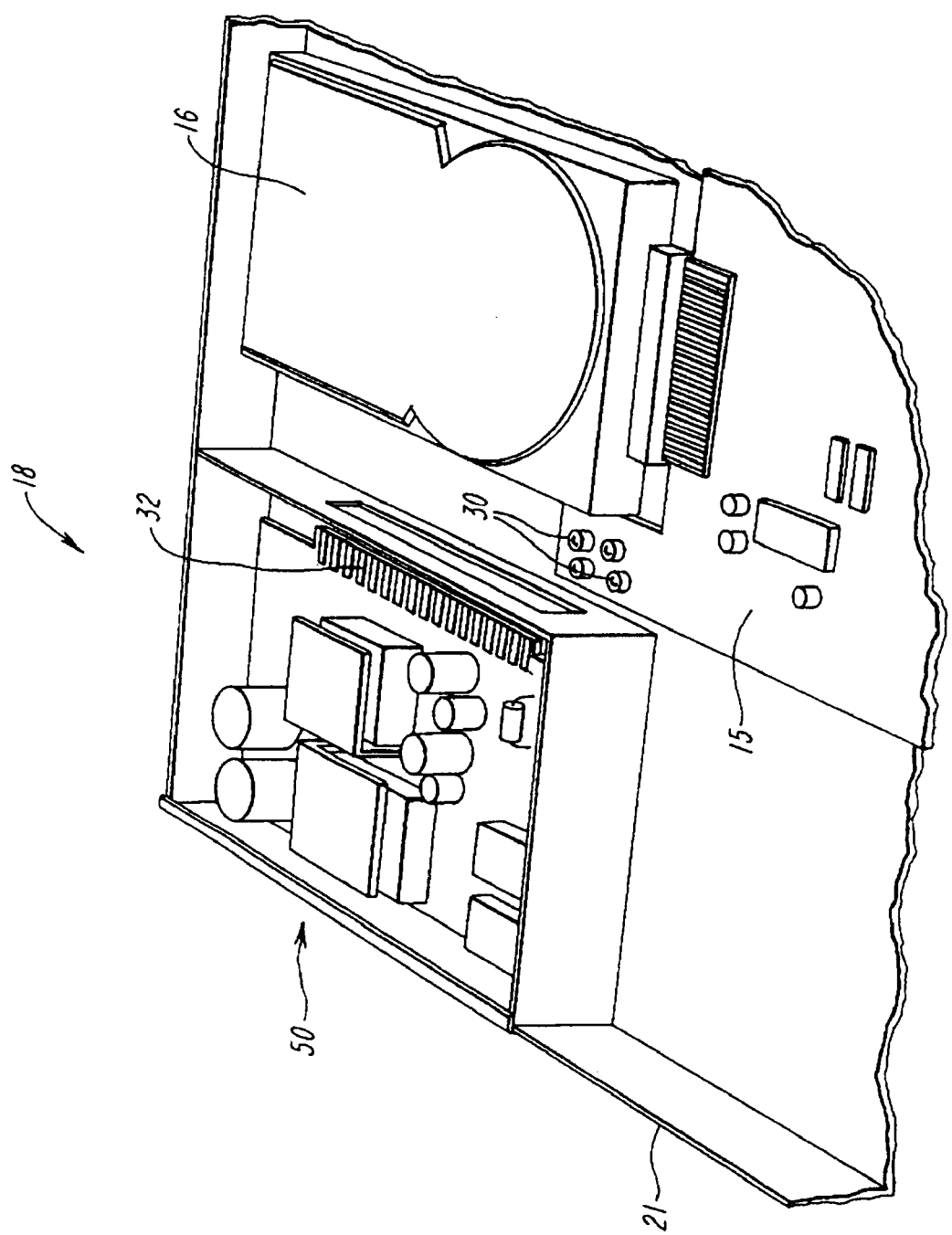
FIG. 2 depicts a portion of a digital data processor device having a power supply and at least one component arranged for power transfer in accordance with the present invention.

FIG. 2 shows a portion of a digital data processing device 18 set up for a power transfer system according to the present invention. Particularly, the illustrated system has a plurality of components, such as a controller or motherboard 15, a disk drive 16, and a power supply 50 which are arranged to be coupled by a power transfer element 20 of the invention (shown in FIG. 3) that mates with the power supply 50 and with one or more of the system components 15, 16 to transfer power from the power supply 50 to the component. For the embodiment illustrated in FIGS. 2 and 3, the power transfer element 50 of FIG. 3 is configured to attach to conductive leads 32 that extend from a board on the power supply 50, and couple power to a discrete number of conductor interconnects.

The illustrated apparatus may for example be a CD-ROM array in a web server of the type used to serve web pages, e.g., on the Internet, an intranet, or other network. The apparatus can comprise any other digital data processing apparatus, such as another type of server, storage bank or computer. The power transfer device and system will be seen to be of general applicability to situations wherein a power supply must be connected to a device having a circuit board, while meeting constraints of space, airflow or wiring integrity.

Figure 3:
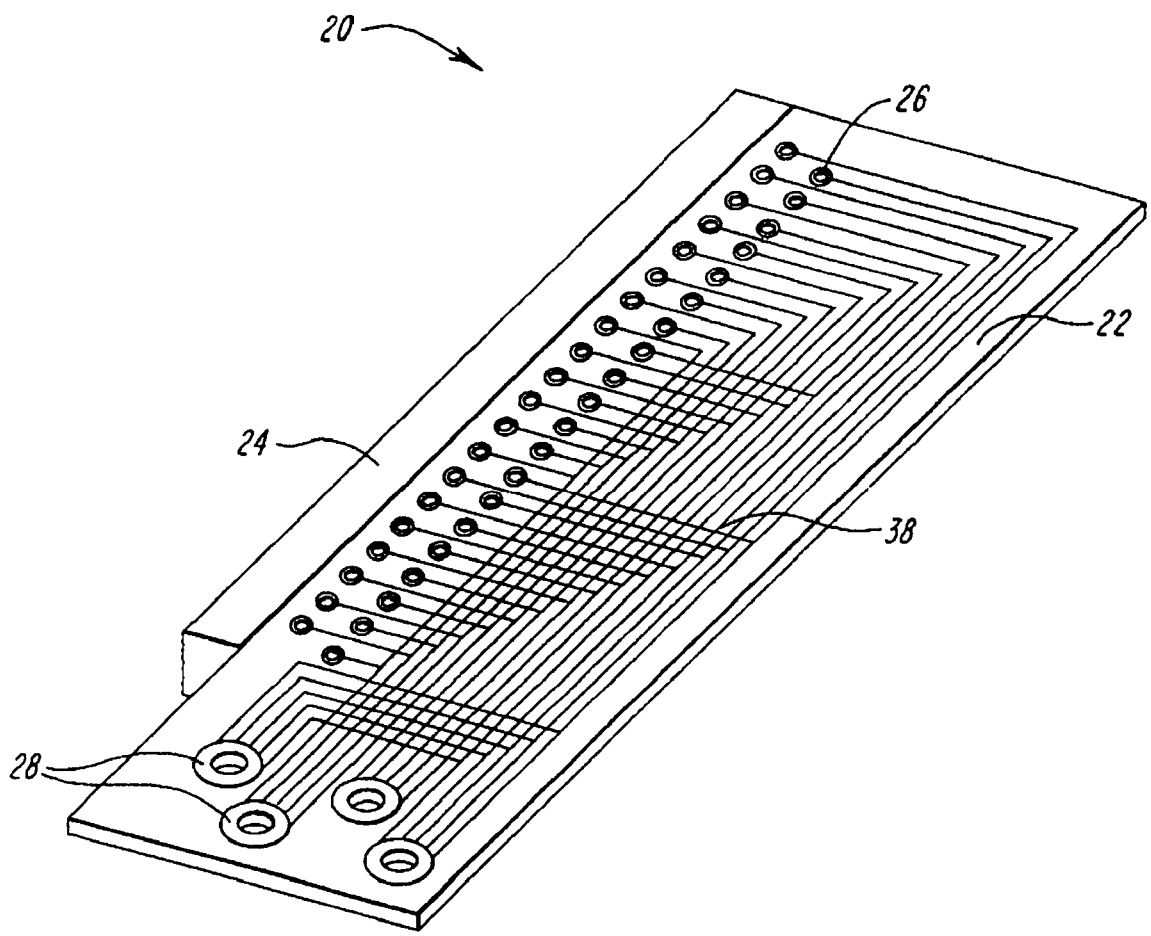
FIG. 3 depicts a power transfer element in accordance with the present invention.

Returning now to a discussion of FIGS. 2 and 3, the digital data processing device 18 is contained in a fully enclosed or partially open housing or chassis 21, e.g., of the type commercially available. In a preferred embodiment, the chassis has a compact form factor, e.g., is a 1U rack-mount storage array, wherein the chassis is 1¾ inches in height. It will be illustrated herein for devices having relatively broad but flat or pancake-like CD-ROM units 16 arrayed within such a rack-mount 1U chassis. However, the invention may also be applied to chassis of greater height, in which, for example disks or boards are oriented vertically to fill the greater height. Thus, the chassis can be of other sizes and configurations, and the basic boards or units can be laid out parallel to a floor, or to a wall of the chassis. The depth and width of the chassis can be selected as desired to accommodate the components.

However, advantageously, the power transfer element 20 of the present invention includes a power transfer card 22 (FIG. 3), that is a circuit board, and has, as a major portion of its power conduction paths, the conductive paths of the circuit board, a printed circuit. The power transfer card 22 has defined dimensions, and advantageously is oriented parallel to other boards, e.g., the power supply, motherboard and/or device component board, so that it is both rigidly positioned and does not obstruct cooling air flow. Preferably, the element 20 is mounted with its narrow edge facing a direction of cooling airflow, and as discussed further below, with the plane of its body offset from boards of one or both of the principal devices. It may therefore present a fixed and small cross-sectional area, enhance the open space available in the chassis, and provide additional flow channels between planes. In general, the conductors 38 of the card 22 extend from a power input region to a power delivery region. A coupling is provided at each region, that orients the card with respect to the board to which it connects.

The power transfer element 20 of the present invention is compact, small in cross-section, and eliminates the need for cables, providing additional space within the chassis. As noted above, adequate ventilation is necessary for proper heat dissipation, since both the power supply and the illustrated devices can generate significant quantities of heat. This problem is further compounded by the contemporary use of more densely packed componentry and by more compact, lower profile devices. Various commonly-owned inventive methods and apparatus have been developed to enhance heat dissipation or cooling mechanisms in densely arrayed web server equipment, and these provide a range of architectures and constructions to which the power transfer elements of the present invention are advantageously applied. For example, co-pending, commonly assigned, U.S. patent application Ser. No. 60/216,055 filed Jul. 5, 2000, entitled "Low Profile Equipment Housing with Angular Fan" provides an angled fan disposed within a chassis for integrating the region around a component into the airflow pattern. Other apparatus and methods include a ventilated slide rail which facilitates the flow of air throughout the chassis which (see co-pending commonly assigned, U.S. patent application Ser. No. 60/215,997, filed Jul. 5, 2000, and Ser. No. 60/244,354, filed Oct. 30, 2000, both entitled "Ventilating Slide Rail Mount."). A third commonly owned invention is a high density storage array having a plurality of digital data storage devices and supporting elements for supporting the storage devices and for providing additional airflow space (see commonly assigned, co-pending U.S. patent application Ser. No. 60/215,975 filed Jul. 5, 2000, entitled "Low Profile, High Density Storage Array" and Ser. No. 60/244,361, filed Oct. 30, 2000, also entitled "Low Profile, High Density Storage Array"). Another is a circuit board riser which among other attributes, occupies less space, thereby providing additional space for airflow to travel (see commonly assigned, co-pending U.S. patent application Ser. No. 60/215,995 filed Jul. 5, 2000, entitled "Circuit Board Riser"). Another commonly owned U.S. patent application Ser. No. 60/215,952, filed Jul. 5, 2000, entitled "Server Architecture and Methods for Digital Data Processing," describes a unique architecture for server systems and the monitoring of physical or utilization status. Each of the foregoing constructions is advantageously employed in a system of the present invention and the power transfer element 20 discussed herein and in greater detail below further provides additional open space within the chassis, allowing for the cooling of such densely packed, and more compact systems, and is compatible with, or extends each of the above inventions, the patent applications of which are all hereby incorporated by reference.

FIG. 3 shows a preferred power transfer element 20 comprising a substantially rigid card-like member 22, e.g. a circuit board, with conductive pathways 38. The substantially rigid card has an edge connector 24 mounted at one end or side of the card, and the pins of this connector couple to the plurality of conductive paths 38 on the card 22. The paths 38 extend in parallel groupings to a plurality of lands or junction regions 28, and these are positioned to bolt down onto, and electrically couple to, the coupling elements 30 (FIG. 2) of the driven component.

Thus, the pathways 38 on the substantially rigid card 22 carry power from the "supply" side of the card 22 to the "component" side, where there reside pads, terminals or other conductive regions 28 for transferring power to the other components of the digital data processing device. In the illustrated embodiment, the pathways comprise copper vias etched onto the surface of the card 22 using photolithography or other conventional technique of the circuit board fabricating arts. In embodiments where the card 22 is fabricated other than from circuit board substrates and materials, appropriate techniques can similarly be employed to establish the pathways 38. The pathways are etched or otherwise fabricated with areas, thickness or other characteristics suitable to carry the desired level of power, i.e., voltages and currents across the card 22. The pads 28 are preferably round, square or other two-dimensional regions that physically contact conductive spacer/fasteners to transfer the power to an adjacent board. In one embodiment, apertures are provided in or adjacent to the pads 28 to receive screws, bolts or other connectors that secure a physical and electrical connection between the pads and conductive elements such as posts, pedestals or pillars 30 of FIG. 2. The posts provide a small, relatively non-obstructing cross section, and may be positioned at a location where airflow is not critical, or not even desirable. They also position the card 22 parallel to and spaced from the underlying component card.

The illustrated power transfer element 20 includes a connector 24 which connects to an output of the power supply to provide electrical and physical coupling therebetween. Connector 24 can be a card edge connector which mounts on the power transfer card 22 by one or more rows of pins, each soldered to a respective path 38 of the card. In that case, the edge connector receives or fits directly over a plurality of conductive lands formed on the edge of a power supply card. In this case, the power transfer card itself will be offset above the plane of the power supply output board. Alternatively, the connector may be a multi-pin plug or female connector, in which case a corresponding mating connector is provided on the power supply. Advantageously, the number of conductive paths 38, and optionally the number of paths on the power supply output board, may be chosen to accommodate the level of power being transferred. Thus, if it is desired to transfer five watts at five volts, the power transfer card may employ ten paths 38, each carrying one-half watt, and these may be connected to a common land 28 to transfer the high net power without overheating the board. In this sense, the paths 38 are "bundled", i.e. arranged in sets having a single supply voltage potential and going to a single output land 28. The connectors can be of any conventional type known in the art sufficient to carry the desired voltages and currents between the power supply and card 20. For example, they may include mating plug and socket connectors on the power supply and the transfer board respectively. A standard connector having pins 26 is shown. The connections may employ a first pin configured as a "power good" pin and remaining pins configured to carrying ground, +/−5V, +/−12V of DC power from the power supply. Though a single pin can be used for each respective power level, a preferred embodiment dedicates multiple pins to each level, and a corresponding plurality of vias 38 on board 20 thereby ensuring sufficient current-carrying capability. As noted above, the vias come together at the pedestal connector lands 28 (FIG. 3) which transfer their potential to the conductive stand-offs, platforms or columns 30 of FIG. 2 to connect to the motherboard 15 or controller card of disk 16.

Figure 4:
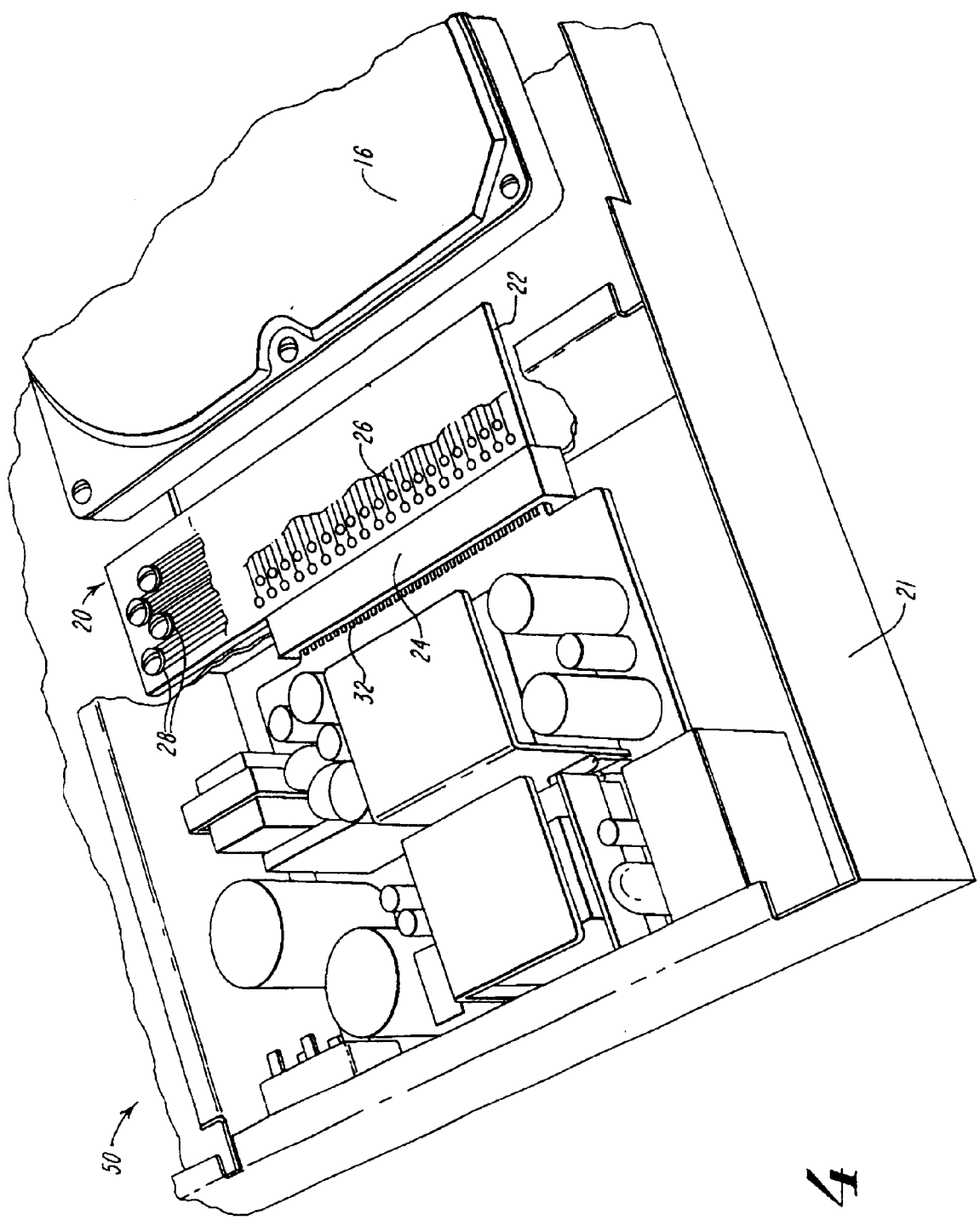
FIG. 4 depicts a portion of a power transfer system in accordance with the present invention.

FIG. 4 illustrates the power transfer card 22 of FIG. 3 positioned to interconnect the power supply 50 and a disk drive 16 as in FIG. 2. As shown, vias or paths at the edge 32 of a power supply board connect with corresponding conductors in an edge connector socket 24 which has its soldered pin connections 26 connected to vias 38 on the board 22, and these each connect, via a corresponding current path (38, FIG. 3) to a contact land 28 adapted for mechanical and electrical contact with the disk drive device board. By way of example, the bundled-current path land 28 may be coupled by a bolt that, conductively secures the board 22 to a metal post or standoff 30 which couples to a similar land 28a connected to the device board. As shown, the power transfer board is parallel to, but offset from, the device board along a direction transverse to the plane of the board.

Figure 4A:
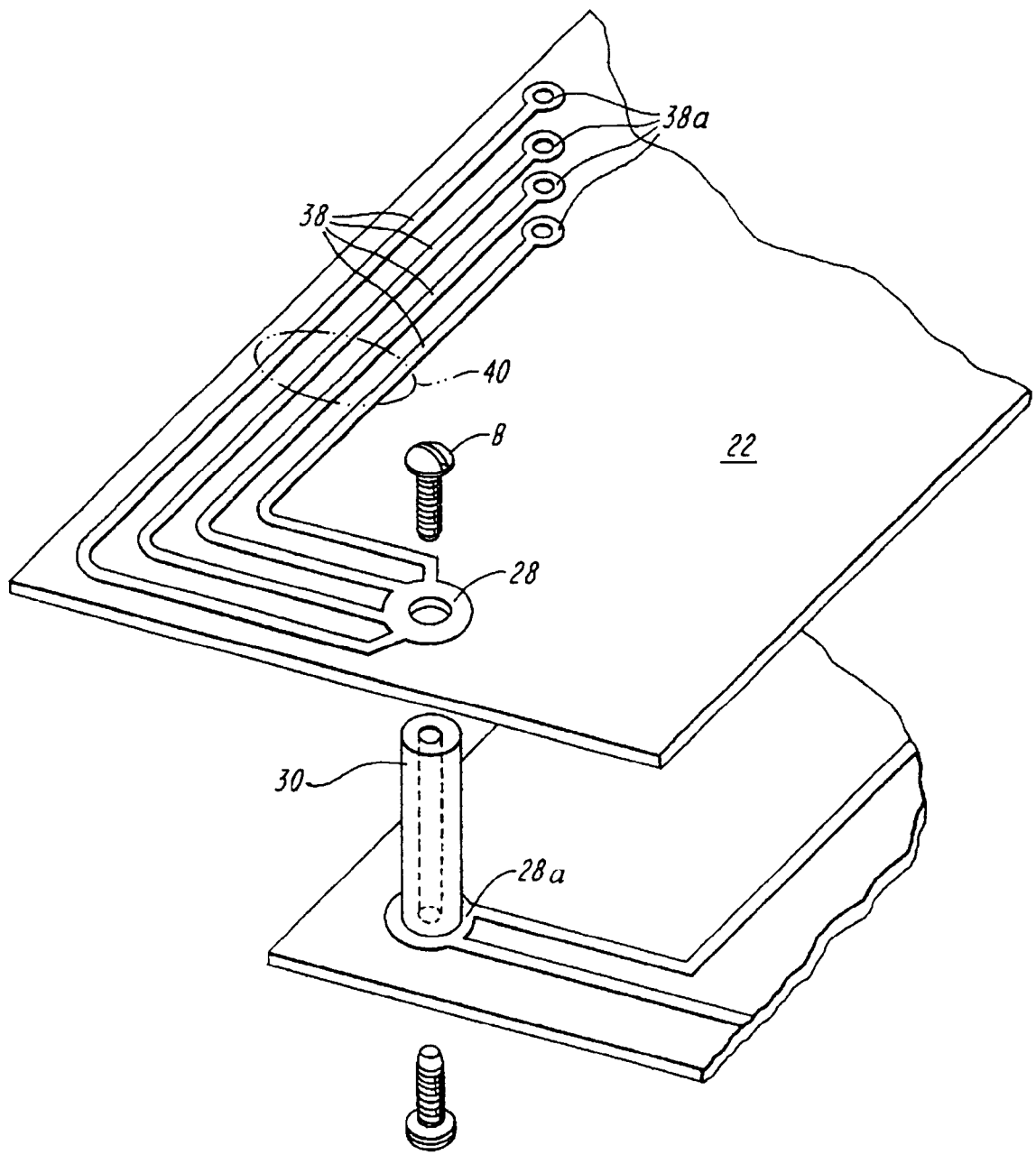
FIG. 4A shows a detail of coupling of a power transfer system in accordance with the present invention.

In configuration shown in FIG. 4A, the paths 38 are bundled, by their common connection to land 28, into a common power jumper having four times the current-carrying capacity of a single circuit board path 38. Other lands may bundle more or fewer lead paths 38, so as to tailor the capacity to device requirements. Furthermore, the power transfer card may have more or fewer than the illustrated four lands 28, depending on the number of different potentials being delivered from the power supply, and on the number of locations on device boards where the power is to be delivered. Generally, existing device boards will be designed so that only a single post connector 30 is required for each voltage level. It will further be understood that the power transfer board 22 may be a multi-layer board, and may utilize through connects if desired, in order to provide a topology effective to connect all the power paths 38 to lands 28 located at the desired positions with respect to an underlying or overlying device board.

In use, the power supply 50 generates power, which is transferred through the edge card 32 into the connector 24. The substantially rigid card 22 is mated with the pins 26 in the connector 24 (as shown in FIG. 3). The power travels from the pins 26 to the substantially rigid card 22 and through the conductive pathways 38. The conductive pathways 38 transfer the power from the pins 26 to the transfer lands 28 in the substantially rigid card 22. Each apertured land 28 receives a specific voltage and amount of power, and these lands are arranged in the plane of the transfer card at locations offset in the X-Y plane to couple through the orthogonal stand-off coupling elements 30 to the system board 15. Conductive pathways on the system board 15 travel from the apertures to specific components 16, thereby providing the required amount of power to each component 16. FIG. 4A illustrates a detail of on possible coupling using posts 30 as described above. The transfer card paths extend from pin-receiving openings 38a to an output land 28, and a bolt B contacts the land and couples it to the post 30, which in turn may couple to a similar conductive land 28a of paths in the powered device. The openings 38a are arranged in one or more regularly-spaced ranks for receiving a standard plug, socket or edge connector 24.

It will be appreciated that the described power transfer connector of the present invention enjoys a symmetry, such that in some embodiments the relative positions of input and output connections on the card may be interchanged. Thus, a set of posts may provide the input and a plug, edge or socket connection may provide the output, or both input and output may employ a single type of coupling. Preferably, however, the connections position the power transfer card to provide power connection in an offset plane. The posts advantageously allow overlap of boards, and permit complete freedom in setting the amount of between-plane offset, thus providing a flexible, modular, non-obstructive power interconnect for use in dense circuitry and arrays such as web servers. In different embodiments, input and output may be provided at a side and an end of the transfer card, two opposite sides, an edge and an internal region, or other locations to flexibly accommodate the physical arrangement of boards and devices on the chassis. Similarly, while the illustrated embodiment involve device board generally parallel to the floor of a chassis, the described construction permits a non-obstructive power connection to devices vertically arrayed in a chassis. Furthermore, in various embodiments, the connector may be positioned parallel to a cooling air flow that is directed front-to-back, or is directed side-to-side, or other direction in a chassis The invention being thus described, further variations and modifications will occur to those skilled in the art, and all such variations and modifications are considered to be within the spirit and scope of the invention, as set forth or defined in the claims appended hereto and equivalents thereof.

All publications and references cited herein are expressly incorporated herein by reference in their entirety.

What is claimed is:

1. In a system having a power supply and a plurality of components, a power transfer element for transferring power from the power supply to the components comprising:
    a substantially rigid power transfer card having
        a plurality of junctions each adapted to transfer power to a respective component,
        a connector,
        a plurality of sets of conductive pathways, each set having one or more conductive pathways, each set transferring power from the connector to a respective one of the junctions, at least one set having a plurality of conductive pathways that are all adapted to transfer power to a same respective junction defining a point of common electrical potential, the card being separate from the power supply and the components; and
    wherein the card is adapted to electrically and physically mate with the power supply and the component.

2. The power transfer element of claim 1, wherein the power transfer card mates with the power supply and the components along couplings that are parallel to or normal to the plane of the card.

3. The power transfer element of claim 1, wherein the power supply has an edge card mating with the connector.

4. The power transfer element of claim 1, wherein at least one component has a circuit board, and wherein the power transfer element further comprises at least one fastening element for removably securing the power transfer card to that circuit board.

5. The power transfer element of claim 4 further comprising at least one aperture in the card for receiving the fastening element.

6. The power transfer element of claim 4, further comprising at least one coupling element for joining the power transfer card and the circuit board.

7. The power transfer element of claim 6, wherein the coupling element comprises a one-to-one connector.

8. A power transfer element comprising:
    a substantially rigid power transfer card having
        a plurality of junctions, each adapted to transfer power to a component,
        a connector,
        a plurality of sets of conductive pathways, each set having one or more conductive pathways, each set transferring power from the connector to a respective one of the junctions, at least one set having a plurality of conductive pathways that are all adapted to transfer power to a same respective junction defining a point of common electrical potential; the connector attached to the card;
    wherein the card and connector are adapted to electrically and physically mate with a power supply and a component.

9. The power transfer element of claim 8, wherein the connector is matable with an edge card in the power supply.

10. The power transfer element of claim 8, wherein the component has a circuit board, and wherein the power transfer element further comprises at least one fastening element for removably securing the card to the circuit board.

11. The power transfer element of claim 10, further comprising at least one aperture in the card for receiving the fastening element.

12. The power transfer element of claim 10, further comprising at least one coupling element for joining the card and the circuit board.

13. The power transfer element of claim 12, wherein the coupling element comprises a one-to-one connector.

14. A power transfer system, comprising:
   a power supply having an edge card;
   an edge connector adapted to mate with the edge card;
   a substantially rigid power transfer card attached to the edge connector and having
      a plurality of junctions, each adapted to transfer power to a component,
      a plurality of sets of conductive pathways, each set having one or more conductive pathways, each set transferring power from the edge connector to a respective one of the junctions, at least one set having a plurality of conductive pathways that are all adapted to transfer power to a same respective junction defining a point of common electrical potential;
      a fastening element for removably securing the power transfer card to a circuit board provided in the component; and
   wherein the edge connector and the power transfer card carry power from the power supply to the component along a substantially rigid and non obstructing path.

15. The power transfer system of claim 14, further comprising at least one aperture in the card for receiving the fastening element.

16. The power transfer system of claim 14, further comprising at least one coupling element for joining the power transfer card and the circuit board.

17. The power transfer system of claim 16, wherein the coupling element comprises a one-to-one connector.

18. A power transfer element, comprising:
   a circuit card matable with a system board; the circuit card having
      a plurality of junctions, each adapted to transfer power to the system board,
      a connector,
      a plurality of sets of conductive pathways, each set having one or more conductive pathways each set transferring power from the connector to a respective one of the junctions, at least one set having a plurality of conductive pathways that are all adapted to transfer power to a same respective junction defining a point of common electrical potential, the connector matable with a power supply;
   wherein the circuit card and connector couple power from the power supply to the system board.

19. The power transfer element of claim 18, wherein the power supply has an edge card matable with the connector.

20. The power transfer element of claim 18, further comprising at least one fastening element for removably securing the circuit card to the system board.

21. The power transfer element of claim 20, further comprising at least one aperture in the circuit card for receiving the fastening element.

22. The power transfer element of claim 20, further comprising at least one coupling element for joining the circuit card and the system board.

23. The power transfer element of claim 22, wherein the coupling element is adapted to receive the fastening element.

24. The power transfer element of claim 22, wherein the coupling element comprises a one-to-one connector.

* * * * *

UNITED STATES PATENT AND TRADEMARK OFFICE
CERTIFICATE OF CORRECTION

PATENT NO.    : 6,721,188 B1
DATED         : April 13, 2004
INVENTOR(S)   : Gerald Jarvis and Robert Wiley It is certified that error appears in the above-identified patent and that said Letters Patent is hereby corrected as shown below:

Column 8,
Line 32, following "the component"; please insert -- s --.

Signed and Sealed this

Seventh Day of December, 2004

JON W. DUDAS
*Director of the United States Patent and Trademark Office*